US012692666B2

(12) United States Patent
    Otsuka

(10) Patent No.: US 12,692,666 B2
(45) Date of Patent: Jul. 28, 2026

(54) ARTICLE TRANSPORT FACILITY

(71) Applicant: Daifuku Co., Ltd., Osaka (JP)

(72) Inventor: Hiroshi Otsuka, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 843 days.

(21) Appl. No.: 18/068,176

(22) Filed: Dec. 19, 2022

(65) Prior Publication Data

US 2023/0193565 A1    Jun. 22, 2023

(30) Foreign Application Priority Data

Dec. 20, 2021    (JP) ................................. 2021-206438

(51) Int. Cl.
    *E01B 7/20* (2006.01)
    *B61B 3/02* (2006.01)
    *E01B 7/10* (2006.01)
    *E01B 25/26* (2006.01)
    *H10P 72/30* (2026.01)

(52) U.S. Cl.
    CPC .................. *E01B 7/20* (2013.01); *E01B 7/10* (2013.01); *E01B 25/26* (2013.01); *B61B 3/02* (2013.01); *H10P 72/3216* (2026.01); *H10P 72/3218* (2026.01); *H10P 72/3221* (2026.01)

(58) Field of Classification Search
    CPC ... E01B 7/20; E01B 7/10; E01B 25/26; B61B 3/02; H01L 21/67727; H01L 21/6773; H01L 21/67733
    See application file for complete search history.

(56) References Cited

U.S. PATENT DOCUMENTS

| | | | | |
|---|---|---|---|---|
| 8,322,287 | B2 * | 12/2012 | Oguro | H01L 21/67733 104/91 |
| 9,061,839 | B2 * | 6/2015 | Murayama | H01L 21/67715 |
| 10,940,878 | B2 * | 3/2021 | Murakami | B61B 3/02 |
| 11,634,278 | B2 * | 4/2023 | Kimura | B65G 1/0492 414/266 |
| 2008/0127851 | A1 * | 6/2008 | Kyutoku | E01B 25/26 104/130.09 |
| 2012/0118845 | A1 * | 5/2012 | Wada | H01L 21/6773 212/71 |
| 2014/0090575 | A1 * | 4/2014 | Nagamine | E01B 25/00 104/91 |
| 2017/0002523 | A1 * | 1/2017 | Ogisu | B61B 3/02 |
| 2018/0297620 | A1 * | 10/2018 | Murakami | B61B 10/02 |
| 2021/0362949 | A1 * | 11/2021 | Morimoto | H01L 21/67715 |

(Continued)

FOREIGN PATENT DOCUMENTS

| | | | | | |
|---|---|---|---|---|---|
| CN | 108373022 | B | * | 5/2021 | ....... H01L 21/67724 |
| DE | 102024209083 | A1 | * | 4/2025 | ............ B61B 13/04 |
| JP | 2008126743 | A | | 6/2008 | |

(Continued)

*Primary Examiner* — Jason C Smith

(74) *Attorney, Agent, or Firm* — The Webb Law Firm

(57) ABSTRACT

A control system executes preliminary biasing processing including controlling a guide wheel drive unit to bias a guide wheel in a direction from a first position toward a second position while the guide wheel is at the first position and is in contact with a first-side surface of a branch guide portion from a first side in a width direction before entering a switching area, and allows the guide wheel to pass through the switching area while executing the preliminary biasing processing.

9 Claims, 10 Drawing Sheets

(56)      References Cited

U.S. PATENT DOCUMENTS

| | | | | |
|---|---|---|---|---|
| 2023/0193565 A1 * | 6/2023 | Otsuka | ................... | E01B 25/26 |
| | | | | 104/130.07 |
| 2024/0059486 A1 * | 2/2024 | Kinugawa | ......... | H01L 21/67259 |

FOREIGN PATENT DOCUMENTS

| | | | | | | |
|---|---|---|---|---|---|---|
| JP | 2012240463 | A | * | 12/2012 | ............ | E01B 25/22 |
| JP | 201931137 | A | | 2/2019 | | |
| JP | 2019031137 | A | * | 2/2019 | ............ | B65G 35/00 |
| JP | 2021049788 | A | * | 4/2021 | ............ | B65G 35/00 |
| JP | 2024118773 | A | * | 9/2024 | | |

* cited by examiner

Fig.2
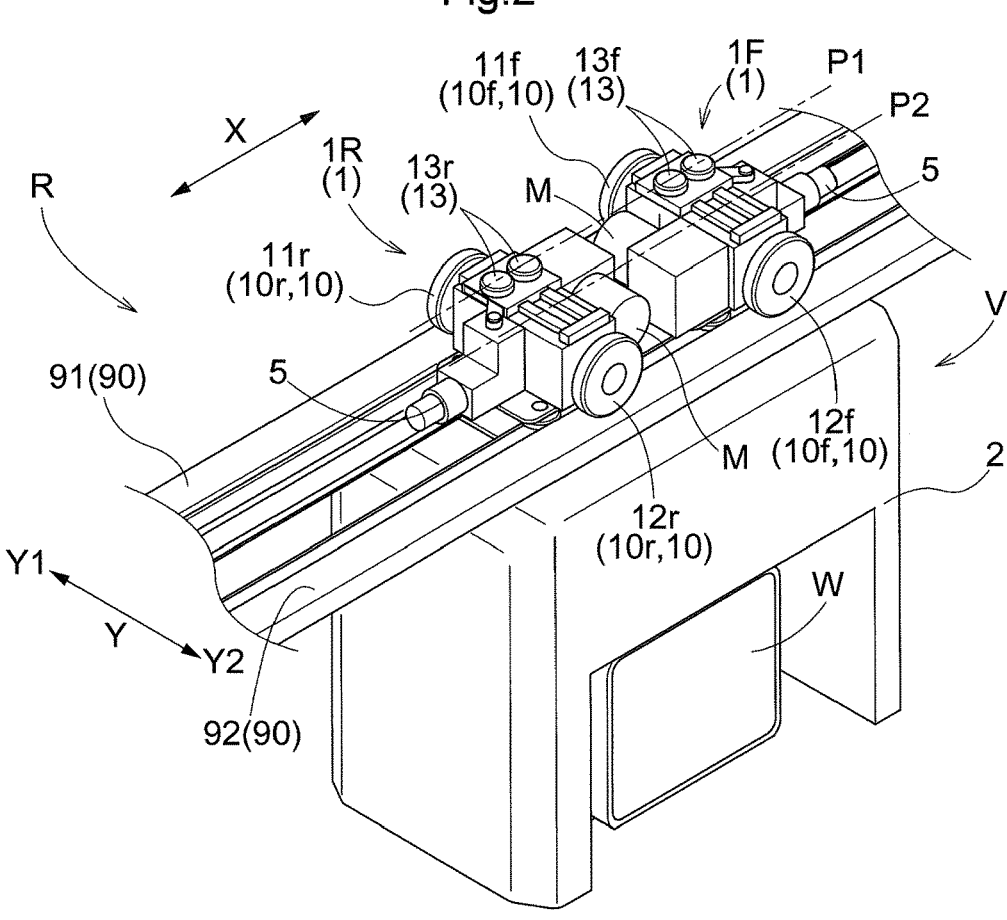
Fig.3
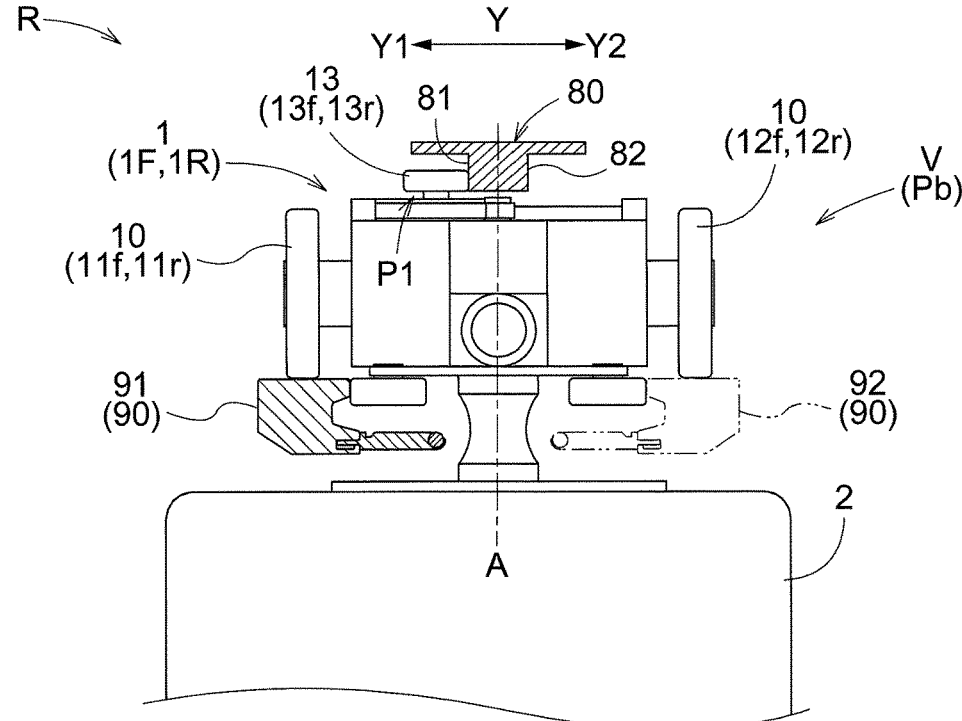

ARTICLE TRANSPORT FACILITY

CROSS-REFERENCE TO RELATED APPLICATION

This application claims priority to Japanese Patent Application No. 2021-206438 filed Dec. 20, 2021, the disclosure of which is hereby incorporated by reference in its entirety.

BACKGROUND OF THE INVENTION

1. Field of the Invention

The present invention relates to an article transport facility including a pair of travel rails extending along a travel route, a transport vehicle configured to travel along the travel route and transport an article, a guide rail configured to guide the direction of travel of the transport vehicle in a branch junction section in which the travel route branches and joins another route, and a control system configured to control the transport vehicle.

2. Description of the Related Art

In the branch junction section, the travel route branches off from a main route and thereafter joins another main route. When the transport vehicle travels through such a branch junction section, the direction of travel of the transport vehicle changes from left to right or from right to left in a short time. JP 2008-126743A discloses an example of an article transport facility including a transport vehicle configured to travel through such a branch junction section. In the following description of the related art, reference numerals shown in parentheses are those used in JP 2008-126743A.

In the article transport facility disclosed in JP 2008-126743A, the position in a width direction of a guide roller (41) provided in a travel unit (40) is switched by shifting the travel unit (40) toward one side (rightward in FIG. 2) in the width direction in a spacing region between a direction control guide (15) that is on the upstream side in the direction of travel and another direction control guide (17) that is downstream of the direction control guide (15) in the direction of travel. While the travel unit (40) is shifted, another guide roller (42) that is on the other side (left in FIG. 2) in the width direction relative to the guide roller (41) and is at a fixed position relative to the guide roller (41) comes into contact with a forward shift guide (18) and is guided by the forward shift guide (18). In this manner, the guide roller (41) is moved toward the one side in the width direction to be guided by the direction control guide (17).

However, in a case where the timing of the operation for shifting the travel unit (40) is delayed, the guide roller (42) comes into contact with the forward shift guide (18) with large impact, and a transport vehicle (30) is likely to vibrate. Also, when a travel speed of the transport vehicle (30) in the branch junction section is reduced to prevent delay of the timing of the operation for shifting the travel unit (40), the efficiency of transporting articles decreases due to the reduction in the travel speed.

SUMMARY OF THE INVENTION

Under the above circumstances, there is demand for suppressing vibration of the transport vehicle and a reduction in its travel speed in the branch junction section. The following is a technique for solving the above issues.

An article transport facility including: a pair of travel rails extending along a travel route; a transport vehicle configured to travel along the travel route and transport an article; a guide rail configured to guide a direction of travel of the transport vehicle in a branch junction section in which the travel route branches and joins another route; and a control system configured to control the transport vehicle, wherein the transport vehicle includes: travel wheels configured to roll on upper surfaces of the pair of travel rails; a guide wheel configured to roll on a first-side surface or a second-side surface of the guide rail; and a guide wheel drive unit configured to move the guide wheel in a width direction between a first position at which the guide wheel rolls on the first-side surface and a second position at which the guide wheel rolls on the second-side surface, the first-side surface facing a first side in the width direction orthogonal to a travel direction extending along the travel route as viewed in an up-down direction, and the second-side surface facing a second side in the width direction, which is opposite to the first side, the branch junction section includes: a first section; a second section extending side by side with the first section; and a connecting section connecting the first section and the second section, the connecting section branches off from the first section toward the first side in the width direction and joins the second section from the second side in the width direction, the guide rail includes a branch guide portion spanning from the first section to an intermediate position in the connecting section, a junction guide portion spanning from an intermediate position in the connecting section to the second section, and a switching area configured to allow the guide wheel to move in the width direction between the branch guide portion and the junction guide portion in the travel direction, in a case where the transport vehicle travels through the branch junction section, the control system executes preliminary biasing processing including controlling the guide wheel drive unit to bias the guide wheel in a direction from the first position toward the second position while the guide wheel is at the first position and is in contact with the first-side surface of the branch guide portion from the first side in the width direction before entering the switching area, and the control system allows the guide wheel to pass through the switching area while executing the preliminary biasing processing.

According to this configuration, as a result of the preliminary biasing processing being executed, the guide wheel is biased in the direction from the first position toward the second position while being at the first position and being in contact with the first-side surface of the branch guide portion from the first side in the width direction before entering the switching area. Then, the guide wheel is allowed to pass through the switching area while the preliminary biasing processing is executed. As described above, the guide wheel is biased before entering the switching area, and accordingly, switching of the position of the guide wheel is not delayed even when the travel speed of the transport vehicle is not reduced, and the guide wheel can be moved from the first position to the second position at the same time as entering the switching area. Moreover, vibration of the transport vehicle can be suppressed because the guide wheel is kept from coming into contact with the guide rail with large impact due to switching of the position of the guide wheel being delayed. As described above, according to this configuration, it is possible to suppress vibration of the transport vehicle and a reduction in the travel speed of the transport vehicle in the branch junction section.

Further features and advantages of the technique according to the present disclosure will be clarified by exemplary and non-limiting embodiments described below with reference to the drawings.

BRIEF DESCRIPTION OF THE DRAWINGS

FIG. 2 is a perspective view of a transport vehicle.

FIG. 3 is a diagram showing a state of the transport vehicle at a branch position as viewed in a travel direction.

DESCRIPTION OF THE INVENTION

The following describes an embodiment of an article transport facility with reference to the drawings.

Figure 1:
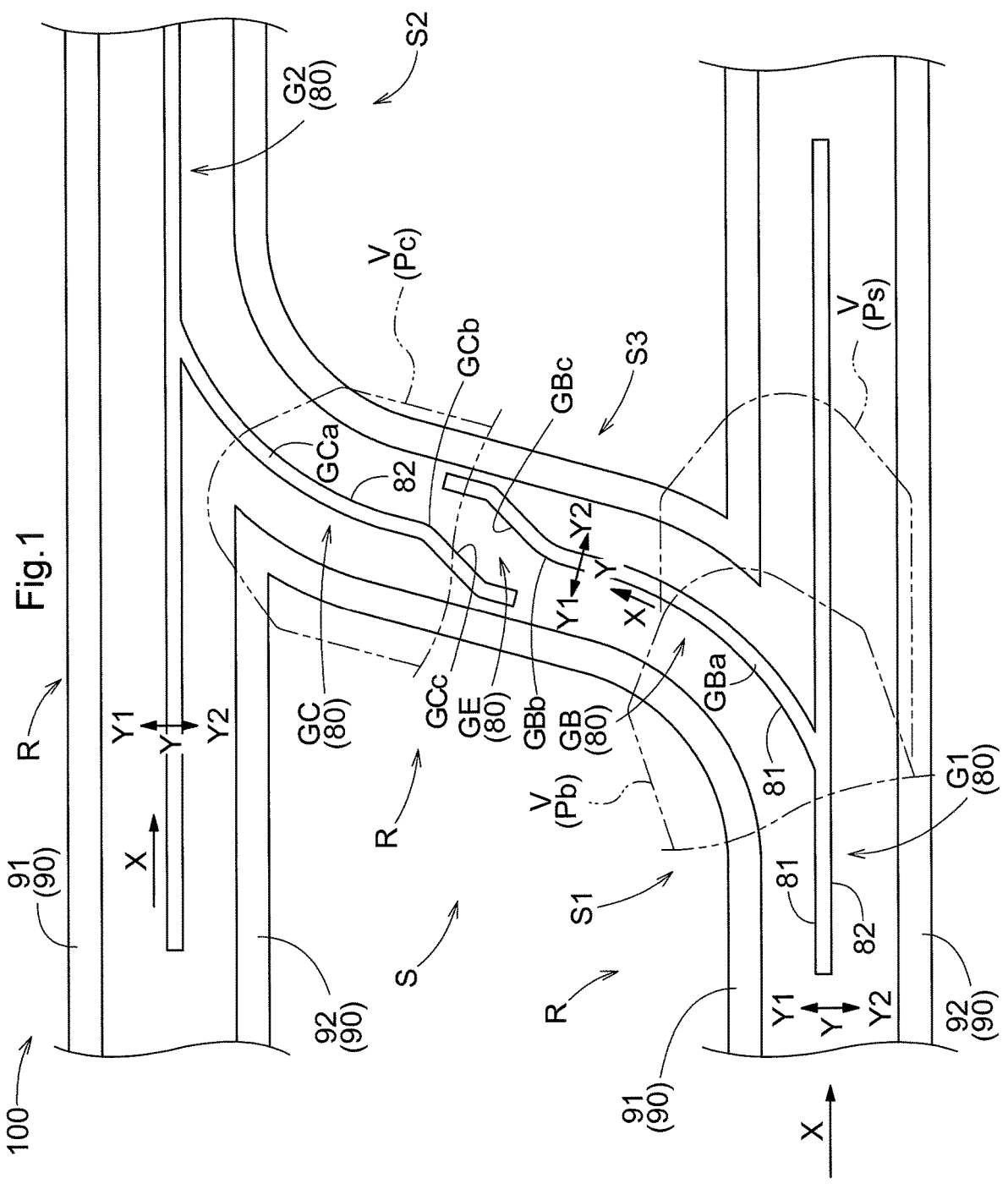
FIG. 1 is a plan view showing a branch-junction section in an article transport facility.

As shown in FIGS. 1 and 2, an article transport facility 100 includes a pair of travel rails 90 extending along a travel route R, a transport vehicle V configured to travel along the travel route R and transport an article W, a guide rail 80 configured to guide the direction of travel of the transport vehicle V in a branch junction section S in which the travel route R branches and joins another route, and a control system H (see FIG. 6) configured to control the transport vehicle V.

In the following description, a direction extending along the travel route R will be referred to as a "travel direction X", and a direction orthogonal to the travel direction X as viewed in an up-down direction will be referred to as a "width direction Y". One side in the width direction Y will be referred to as a "first side Y1 in the width direction", and the other side in the width direction Y will be referred to as a "second side Y2 in the width direction". For example, the first side Y1 in the width direction is the left side as viewed in the direction of travel of the transport vehicle V, and the second side Y2 in the width direction is the opposite side, i.e., the right side. However, the first side Y1 in the width direction and the second side Y2 in the width direction do not specify either of the left side and the right side. The first side Y1 in the width direction may also be the right side and the second side Y2 in the width direction may also be the left side.

As shown in FIG. 1, the branch junction section S includes a first section S1, a second section S2 extending side by side with the first section S1, and a connecting section S3 connecting the first section S1 and the second section S2.

In the present embodiment, the first section S1 and the second section S2 are parallel to each other.

In this example, the first section S1 and the second section S2 extend along the same direction. However, the direction in which the first section S1 extends may be inclined relative to the direction in which the second section S2 extends. In the illustrated example, the first section S1 is straight. Also, the second section S2 is straight.

The connecting section S3 branches off from the first section S1 toward the first side Y1 in the width direction and joins the second section S2 from the second side Y2 in the width direction. In the present embodiment, the connecting section S3 extends along a direction that is inclined relative to the direction in which the first section S1 and the second section S2 extend. The direction in which the connecting section S3 extends includes a component extending along the direction in which the first section S1 and the second section S2 extend. In the present embodiment, a joint portion between the connecting section S3 and the first section S1 is a curved section. Also, a joint portion between the connecting section S3 and the second section S2 is a curved section.

In the present embodiment, either one of the pair of travel rails 90 is divided in the joint portion between the connecting section S3 and the first section S1. Also, either one of the pair of travel rails 90 is divided in the joint portion between the connecting section S3 and the second section S2. Although described in detail later, when the transport vehicle V travels through the joint portion between the connecting section S3 and the first section S1 and the joint portion between the connecting section S3 and the second section S2, the transport vehicle V enters a single-side travel state in which travel wheels 10 on the first side Y1 in the width direction or travel wheels 10 on the second side Y2 in the width direction are in the air.

The pair of travel rails 90 extend along the travel route R, at positions spaced apart from each other in the width direction Y Hereinafter, one of the pair of travel rails 90 on the first side Y1 in the width direction will be referred to as a "first travel rail 91", and the other travel rail 90 on the second side Y2 in the width direction will be referred to as a "second travel rail 92". Note that, in the following description, the first travel rail 91 and the second travel rail 92 may be collectively simply referred to as "travel rails 90".

In the present embodiment, the pair of travel rails 90 are above a floor surface and spaced apart therefrom. For example, the pair of travel rails 90 are suspended from a ceiling.

The guide rail 80 is above the pair of travel rails 90 (see FIG. 3, for example). That is, the guide rail 80 is above the floor surface and spaced apart therefrom similarly to the pair of travel rails 90. For example, the guide rail 80 is suspended from the ceiling.

The guide rail 80 is provided in the branch junction section S. The guide rail 80 includes a first guide portion G1 that is in the first section S1, a branch guide portion GB spanning from the first section S1 to an intermediate position in the connecting section S3, a junction guide portion GC spanning from an intermediate position in the connecting section S3 to the second section S2, and a second guide portion G2 that is in the second section S2. The guide rail 80 further includes a switching area GE configured to allow guide wheels 13, which will be described later, to move in the width direction Y between the branch guide portion GB and the junction guide portion GC in the travel direction X.

The branch guide portion GB is continuous from the first guide portion G1. In the present embodiment, the branch guide portion GB branches off from the first guide portion G1 toward the first side Y1 in the width direction. In this example, the branch guide portion GB extends from the first guide portion G1 while curving like an arc toward the first side Y1 in the width direction. Note that the first guide portion G1 is straight.

In the present embodiment, the branch guide portion GB includes a branch side extending portion GBa extending along the travel direction X, a branch side curved portion GBb that is continuous from the branch side extending portion GBa and curves protruding toward the first side Y1 in the width direction, and a branch side inclined portion GBc that is continuous from the branch side curved portion GBb and is inclined toward the second side Y2 in the width direction as getting closer to the downstream side in the travel direction X.

The junction guide portion GC is continuous to the second guide portion G2. In the present embodiment, the junction guide portion GC joins the second guide portion G2 from the second side Y2 in the width direction. In this example, the junction guide portion GC extends from the intermediate position in the connecting section S3 toward the second guide portion G2 while curving like an arc. Note that the second guide portion G2 is straight.

In the present embodiment, the junction guide portion GC includes a junction side inclined portion GCc that is inclined toward the second side Y2 in the width direction as getting closer to the downstream side in the travel direction X, a junction side curved portion GCb that is continuous from the junction side inclined portion GCc and curves protruding toward the second side Y2 in the width direction, and a junction side extending portion GCa that is continuous from the junction side curved portion GCb and extends along the travel direction X.

As shown in FIG. 2, in the present embodiment, the transport vehicle V is configured as a ceiling transport vehicle that transports an article W along the travel route R set near the ceiling. The article W to be transported by the transport vehicle V is a FOUP (Front Opening Unified Pod) for storing a semiconductor wafer, a reticle pod for storing a reticle, or the like, for example.

The transport vehicle V includes travel wheels 10 configured to roll on upper surfaces of the pair of travel rails 90 and a travel wheel drive unit M configured to drive the travel wheels 10. The travel wheels 10 include a plurality of travel wheels 10 spaced apart from each other in at least either the travel direction X or the width direction Y. In this example, the plurality of travel wheels 10 are spaced apart from each other in the travel direction X and the width direction Y. The travel wheel drive unit M is constituted by an electric motor such as a servomotor, for example.

In the present embodiment, the plurality of travel wheels 10 include front wheels 10f and rear wheels 10r. Specifically, the plurality of travel wheels 10 include a first front wheel 11f configured to roll on the upper surface of the first travel rail 91, a first rear wheel 11r configured to roll on the first travel rail 91 behind the first front wheel 11f in the direction of travel, a second front wheel 12f configured to roll on the upper surface of the second travel rail 92, and a second rear wheel 12r configured to roll on the second travel rail 92 behind the second front wheel 12f in the direction of travel. That is, the front wheels 10f in this example include the first front wheel 11f and the second front wheel 12f. The rear wheels 10r include the first rear wheel 11r and the second rear wheel 12r.

In the present embodiment, the transport vehicle V includes a travel portion 1 and a main body portion 2. The travel portion 1 is above the travel rails 90 and configured to make the transport vehicle V travel. The main body portion 2 is below the travel rails 90 and coupled to the travel portion 1. In this example, the main body portion 2 is configured to support an article W. The article W supported by the main body portion 2 is transported by the transport vehicle V.

In the present embodiment, the travel portion 1 includes a front travel portion 1F and a rear travel portion 1R that is behind the front travel portion 1F in the direction of travel. In this example, the front travel portion 1F supports the first front wheel 11f and the second front wheel 12f. The rear travel portion 1R supports the first rear wheel 11r and the second rear wheel 12r. That is, in the present embodiment, the transport vehicle V includes the front travel portion 1F including the front wheels 10f (the first front wheel 11f and the second front wheel 12f) as the travel wheels 10 and the rear travel portion 1R including the rear wheels 10r (the first rear wheel 11r and the second rear wheel 12r) as the travel wheels 10.

As shown in FIGS. 2 to 5, the transport vehicle V includes: a guide wheel 13 configured to roll on a first-side surface 81 of the guide rail 80, which surface faces the first side Y1 in the width direction, or a second-side surface 82 of the guide rail 80, which surface faces the second side Y2 in the width direction; and a guide wheel drive unit 5 configured to move the guide wheel 13 in the width direction Y between a first position P1 at which the guide wheel 13 rolls on the first-side surface 81 and a second position P2 at which the guide wheel 13 rolls on the second-side surface 82.

The guide wheel 13 is supported by the travel portion 1 in such a manner as to be turnable about an up-down axis. With this configuration, the guide wheel 13 is rollable along the first-side surface 81 and the second-side surface 82 of the guide rail 80. Note that the travel wheels 10 described above are supported by the travel portion 1 in such a manner as to be turnable about an axis extending along the width direction Y.

The guide wheel drive unit 5 is configured to move the guide wheel 13 along the width direction Y by biasing the guide wheel 13 in the width direction Y. The guide wheel drive unit 5 is configured to thus change the position of the guide wheel 13 in the width direction Y between the first position P1 set on the first side Y1 in the width direction relative to the center A (see FIGS. 3 to 5) of the travel portion 1 in the width direction Y and the second position P2 set on the second side Y2 in the width direction relative to the center A of the travel portion 1 in the width direction Y. The guide wheel drive unit 5 is constituted by a rotary solenoid, for example, and changes the position of the guide wheel 13 between the first position P1 and the second position P2 according to an energized state.

As shown in FIG. 3, the guide wheel 13 rolls on the first-side surface 81 of the guide rail 80 and is appropriately guided by the guide rail 80 in a case where the guide wheel 13 passes through a region provided with the guide rail 80 in the state where the guide wheel 13 is at the first position P1.

Figure 4:
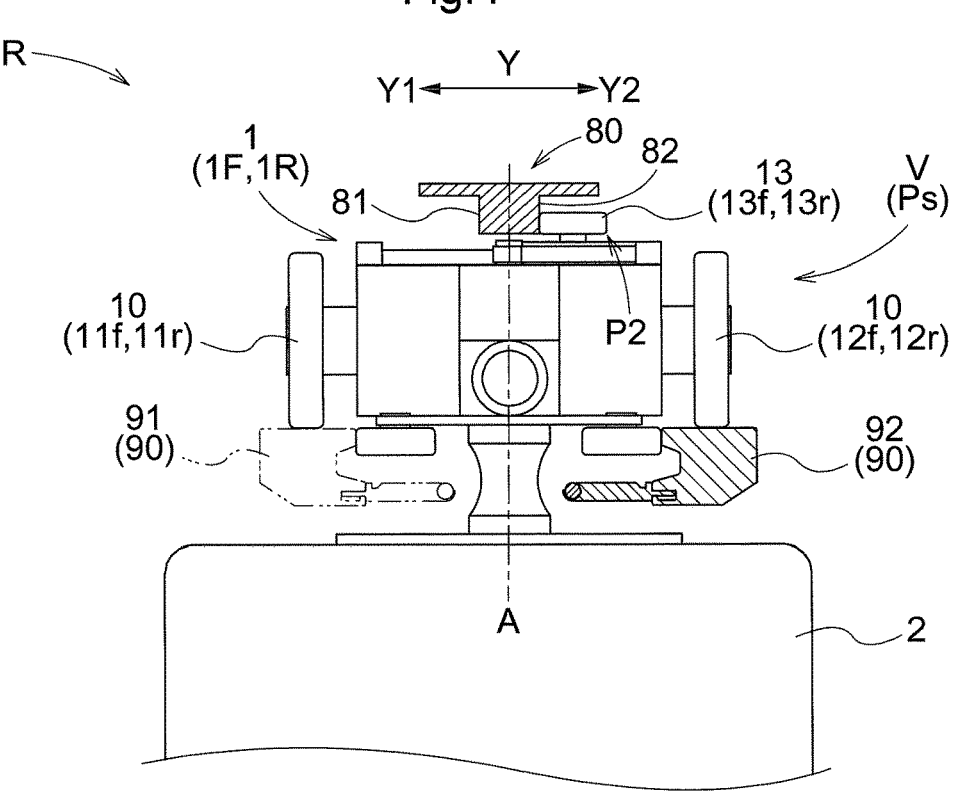
FIG. 4 is a diagram showing a state of the transport vehicle at a straight travel position as viewed in the travel direction.

As shown in FIG. 4, the guide wheel 13 rolls on the second-side surface 82 of the guide rail 80 and is appropriately guided by the guide rail 80 in a case where the guide wheel 13 passes through the region provided with the guide rail 80 in the state where the guide wheel 13 is at the second position P2.

As shown in FIG. 2, the transport vehicle V in the present embodiment includes a front guide wheel 13f serving as the guide wheel 13 in the front travel portion 1F and a rear guide wheel 13r serving as the guide wheel 13 in the rear travel portion 1R. In the illustrated example, a pair of front guide wheels 13f arranged in the travel direction X at the same position in the width direction Y are supported by the front travel portion 1F. Also, a pair of rear guide wheels 13r arranged in the travel direction X at the same position in the width direction Y are supported by the rear travel portion 1R. In this example, a plurality of the guide wheel drive units 5 are provided in correspondence with the front guide wheels 13f and the rear guide wheels 13r. The front guide wheels 13f (in this example, the pair of front guide wheels 13f) are driven independently from the rear guide wheels 13r (in this example, the pair of rear guide wheels 13r). Hereinafter, the front guide wheels 13f and the rear guide wheels 13r may be collectively simply referred to as "guide wheels 13".

Here, FIG. 1 shows the transport vehicle V with imaginary lines at a branch position Pb that the transport vehicle V passes when traveling in the direction branched from the travel route R, a straight travel position Ps that the transport vehicle V passes when traveling straight along the travel route R, and a junction foreside position Pc that the transport vehicle V passes before entering another travel route R after traveling in the direction branched from the travel route R.

In the present embodiment, either one of the pair of travel rails 90 is divided in the joint portion between the connecting section S3 and the first section S1 as described above. In a case where the transport vehicle V travels through the joint portion between the connecting section S3 and the first section S1 in the branched direction and passes the branch position Pb and a case where the transport vehicle V travels straight through the joint portion between the connecting section S3 and the first section S1 and passes the straight travel position Ps, the transport vehicle V enters the single-side travel state in which the travel wheels 10 on the first side Y1 in the width direction or the travel wheels 10 on the second side Y2 in the width direction are in the air.

FIG. 3 shows the transport vehicle V in the single-side travel state at the branch position Pb. As shown in FIG. 3, when traveling at the branch position Pb, the transport vehicle V is in the single-side travel state in which the second front wheel 12f and the second rear wheel 12r are in the air. In this case, the first front wheel 11f and the first rear wheel 11r roll on the upper surface of the first travel rail 91, and the guide wheels 13 roll on the first-side surface 81 of the guide rail 80. The transport vehicle V travels along the travel route R while maintaining a horizontal state (horizontal position) by means of at least the first front wheel 11f, the first rear wheel 11r, and the guide wheels 13.

FIG. 4 shows the transport vehicle V in the single-side travel state at the straight travel position Ps. As shown in FIG. 4, when traveling at the straight travel position Ps, the transport vehicle V is in the single-side travel state in which the first front wheel 11f and the first rear wheel 11r are in the air. In this case, the second front wheel 12f and the second rear wheel 12r roll on the upper surface of the second travel rail 92, and the guide wheels 13 roll on the second-side surface 82 of the guide rail 80. The transport vehicle V travels along the travel route R while maintaining the horizontal state (horizontal position) by means of at least the second front wheel 12f, the second rear wheel 12r, and the guide wheels 13.

Figure 5:
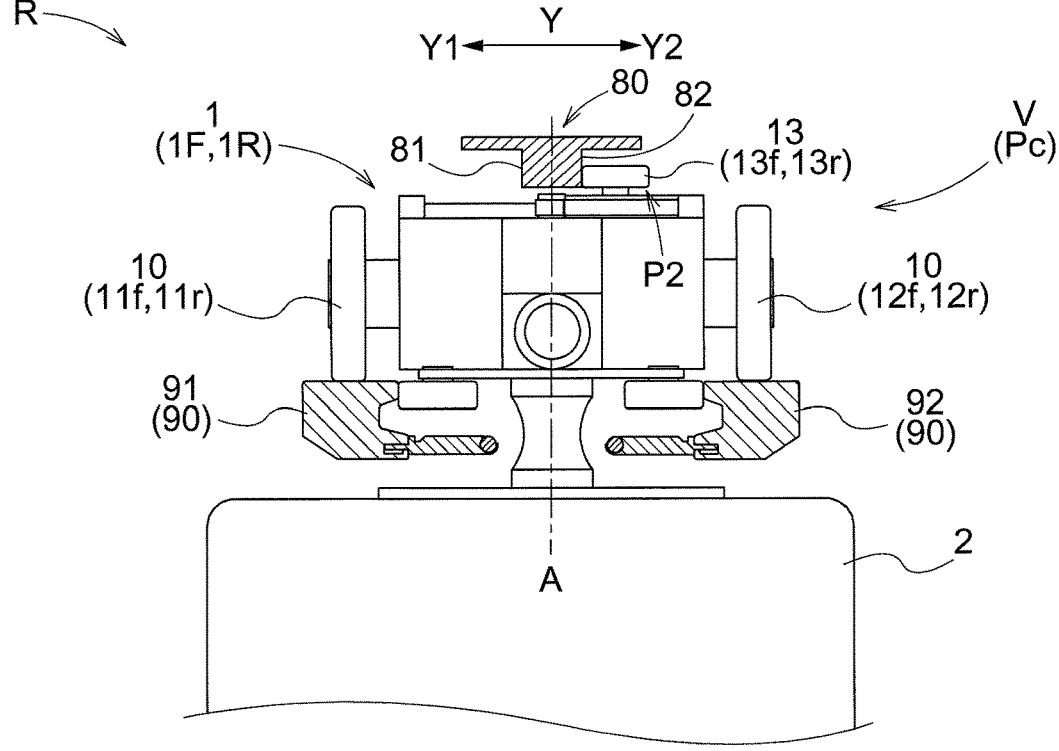
FIG. 5 is a diagram showing a state of the transport vehicle at a junction foreside position as viewed in the travel direction.

As shown in FIG. 5, at the junction foreside position Pc at which neither of the pair of travel rails 90 is divided, the transport vehicle V is in a double-side travel state in which the travel wheels 10 on the first side Y1 in the width direction and the travel wheels 10 on the second side Y2 in the width direction are placed on the travel rails 90. When the transport vehicle V is traveling at the junction foreside position Pc, the first front wheel 11f and the first rear wheel 11r roll on the upper surface of the first travel rail 91, the second front wheel 12f and the second rear wheel 12r roll on the upper surface of the second travel rail 92, and the guide wheels 13 roll on the second-side surface 82 of the guide rail 80. Note that the transport vehicle V also travels in the double-side travel state in a section in which the guide rail 80 is not provided. In this case, the guide wheels 13 are at the first position P1 or the second position P2 without coming into contact with anything because the guide rail 80 is not provided.

Figure 6:
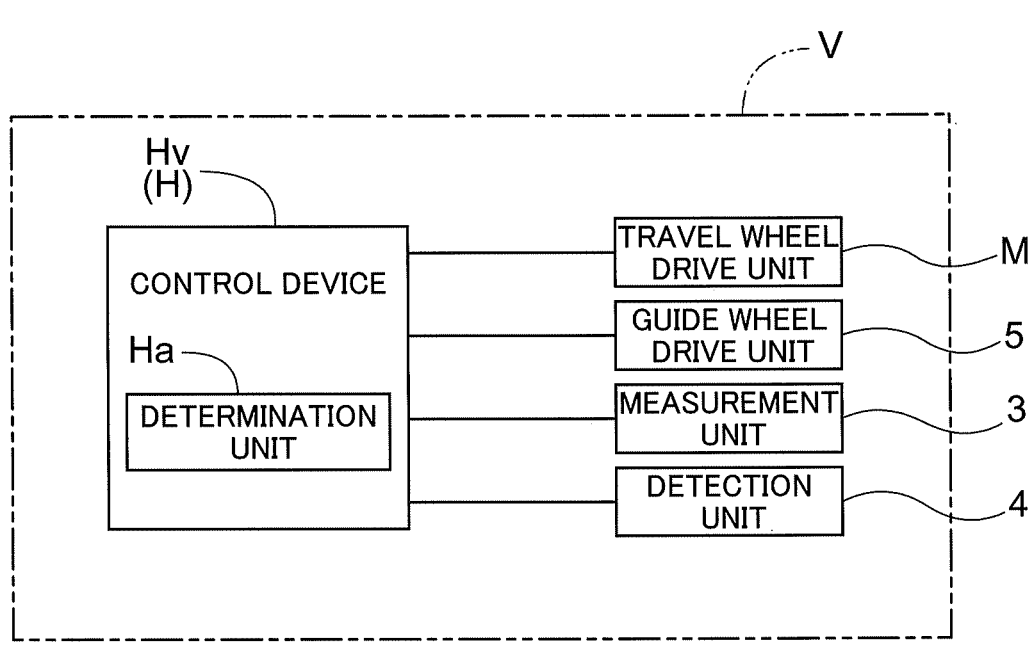
FIG. 6 is a control block diagram.

As shown in FIG. 6, in the present embodiment, a control device Hv is shown as an example of the control system H. The control device Hv is mounted on the transport vehicle V, for example. The control system H includes the control device Hv and a host controller (not shown) that is provided separately from the transport vehicle V and manages a portion or the entirety of the facility. However, the control system H may also be constituted only by the control device Hv mounted on the transport vehicle V. The control system H includes a processor such as a microcomputer and peripheral circuits such as a memory, for example. Each function is realized as a result of these hardware units cooperating with a program executed by the processor such as a computer.

In the present embodiment, the control system H controls travel of the transport vehicle V by controlling the travel wheel drive unit M. This realizes acceleration, deceleration, stopping, and the like of the transport vehicle V. Also, the control system H controls the direction of a biasing force applied to the guide wheels 13 by controlling the guide wheel drive units 5. Specifically, the control system H biases the guide wheels 13 toward the first side Y1 in the width direction or the second side Y2 in the width direction by controlling the guide wheel drive units 5. The guide wheels 13 are placed at the first position P1 when biased toward the first side Y1 in the width direction in a state where the guide wheels 13 do not interfere with the guide rail 80. The guide wheels 13 are placed at the second position P2 when biased toward the second side Y2 in the width direction in a state where the guide wheels 13 do not interfere with the guide rail 80.

In the present embodiment, the transport vehicle V includes a measurement unit 3 configured to measure rotation speeds of the travel wheels 10 and a detection unit 4 configured to detect a current position of the transport vehicle V. The control system H is configured to obtain results of measurement performed by the measurement unit 3 and results of detection performed by the detection unit 4.

In the present embodiment, the measurement unit 3 is configured to measure, in addition to the rotation speeds of the travel wheels 10, a distance traveled by the transport vehicle V based on the rotation speeds. The measurement unit 3 is constituted by rotary encoders, for example. In this example, the measurement unit 3 is configured to measure a rotation speed of the front wheels 10f and a rotation speed of the rear wheels 10r separately from each other. In other words, the rotary encoders constituting the measurement unit 3 are provided in correspondence with the front wheels 10$f$ and the rear wheels 10$r$, respectively.

Figure 7:
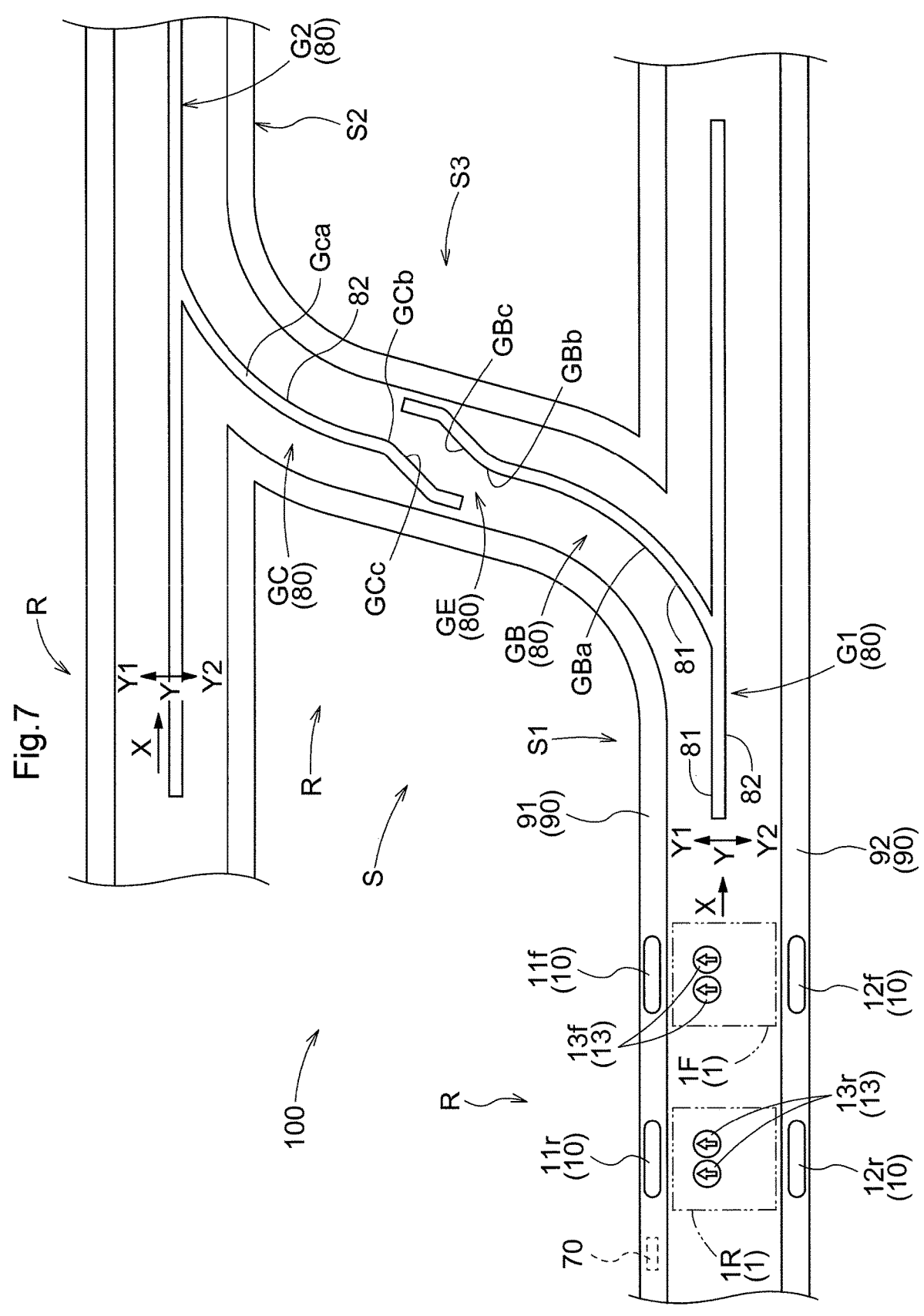
FIG. 7 is a diagram showing a state at a point in time before the transport vehicle enters the branch junction section.

In the present embodiment, the detection unit 4 is configured to read information from an information holder 70 disposed on the travel route R (see FIG. 7). The information holder 70 holds address information (information indicating a position on the travel route R) regarding the position of the information holder 70. Accordingly, the detection unit 4 can detect a current position of the transport vehicle V by reading the address information held by the information holder 70. For example, a one-dimensional code or a two-dimensional code can be used as the information holder 70, and a one-dimensional code reader or a two-dimensional code reader can be used as the detection unit 4.

As shown in FIG. 7, the information holder 70 is located just before the branch junction section S. The detection unit 4 detects that the transport vehicle V is located just before the branch-junction section S by reading the information held by the information holder 70.

As shown in FIG. 6, in the present embodiment, the control system H includes a determination unit Ha configured to determine that the guide wheels 13 have come into contact with the branch guide portion GB after entering the first section S1. As described above with reference to FIG. 1, in the present embodiment, the branch guide portion GB is continuous from the first guide portion G1, which is straight, and extends from the first guide portion G1 while curving like an arc toward the first side Y1 in the width direction. Accordingly, when the guide wheels 13 rolling on the guide rail 80 enter the branch guide portion GB from the first guide portion G1, the direction of travel of the transport vehicle V starts to change. That is, the transport vehicle V starts to travel along a curve upon the guide wheels 13 starting to come into contact with the branch guide portion GB.

In a case where the transport vehicle V travels along a curve in the double-side travel state, the rotation speed of a travel wheel 10 on the inner side of the curve becomes lower than the rotation speed of a travel wheel 10 on the outer side of the curve, and a difference arises between the rotation speeds of these wheels. Note that, in the present embodiment, the first front wheel 11$f$ and the second front wheel 12$f$ are driven to rotate at the same speed, and the first rear wheel 11$r$ and the second rear wheel 12$r$ are driven to rotate at the same speed. The transport vehicle V travels along the curve in the single-side travel state. Therefore, the above-described difference between rotation speeds does not arise in the present embodiment. In a case where the front wheel 10$f$ on the inner side of a curve travels along the curved portion of the travel rail 90 while the rear wheel 10$r$ on the same side as this front wheel 10$f$ in the width direction Y travels along a straight portion of the travel rail 90 just before the curved portion, the rotation speed of the front wheel 10$f$ becomes lower than the rotation speed of the rear wheel 10$r$, and a difference arises between the rotation speeds of these wheels. To the contrary, in a case where the front wheel 10$f$ on the outer side of a curve travels along the curved portion of the travel rail 90 while the rear wheel 10$r$ on the same side as this front wheel 10$f$ in the width direction Y travels along a straight portion of the travel rail 90 just before the curved portion, the rotation speed of the front wheel 10$f$ becomes higher than the rotation speed of the rear wheel 10$r$, and a difference arises between the rotation speeds of these wheels.

In the present embodiment, the determination unit Ha determines that the guide wheels 13 have started to come into contact with the branch guide portion GB in response to a rotation speed difference between rotation speeds of two or more target travel wheels 10 spaced apart from each other in the travel direction X or the width direction Y changing by an amount greater than or equal to a prescribed threshold value. In this example, the rotation speed difference is a difference between (i) a rotation speed of at least one of the first rear wheel 11$r$ and the second rear wheel 12$r$ and (ii) a rotation speed of at least one of the first front wheel 11$f$ and the second front wheel 12$f$, and the determination unit Ha determines that the guide wheels 13 have started to come into contact with the branch guide portion GB based on the rotation speed difference.

Figure 8:
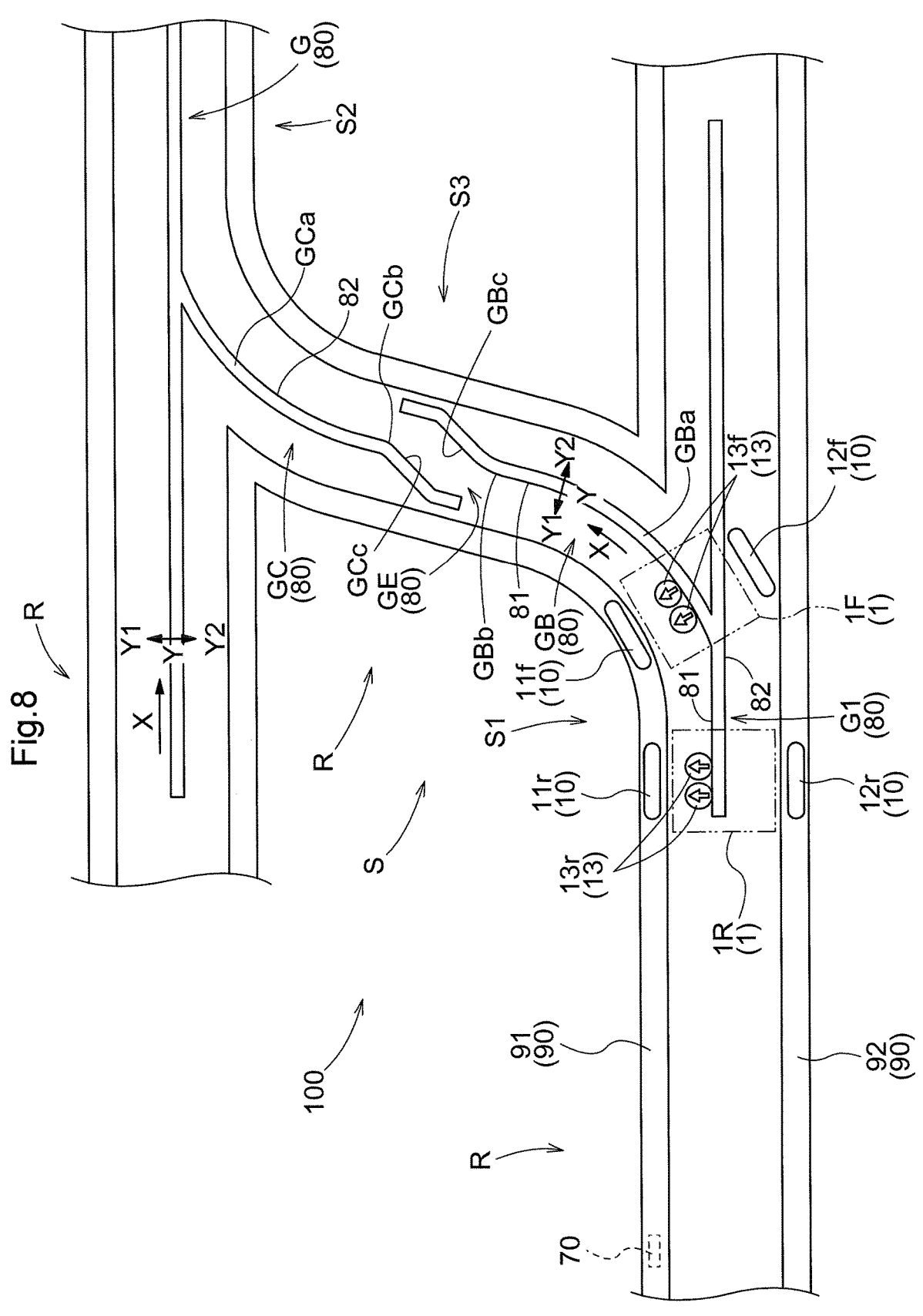
FIG. 8 is a diagram showing a state at a point in time at which front guide wheels start to come into contact with a branch guide portion.

In the example shown in FIG. 8, the determination unit Ha determines that the guide wheels 13 (front guide wheels 13$f$) have started to come into contact with the branch guide portion GB in response to a rotation speed difference between a rotation speed of the first rear wheel 11$r$ and a rotation speed of the first front wheel 11$f$ changing by an amount greater than or equal to the prescribed threshold value. In the example shown in FIG. 8, when the front guide wheels 13$f$ start to come into contact with the branch guide portion GB, the first rear wheel 11$r$ rolls on a straight portion of the travel rail 90 and the first front wheel 11$f$ rolls on a curved portion (the inner side of the curved portion) of the travel rail 90. Accordingly, the first rear wheel 11$r$ rolls over a longer distance than the first front wheel 11$f$, and a rotation speed difference arises between the first rear wheel 11$r$ and the first front wheel 11$f$. The determination unit Ha determines that the front guide wheels 13$f$ have started to come into contact with the branch guide portion GB in response to the rotation speed difference changing by an amount greater than or equal to the prescribed threshold value. The "prescribed threshold value" is preferably determined in advance through experiment or the like with consideration given to the travel speed of the transport vehicle V, the radius of curvature of the curved portion of the travel rail 90, and the like.

Figure 9:
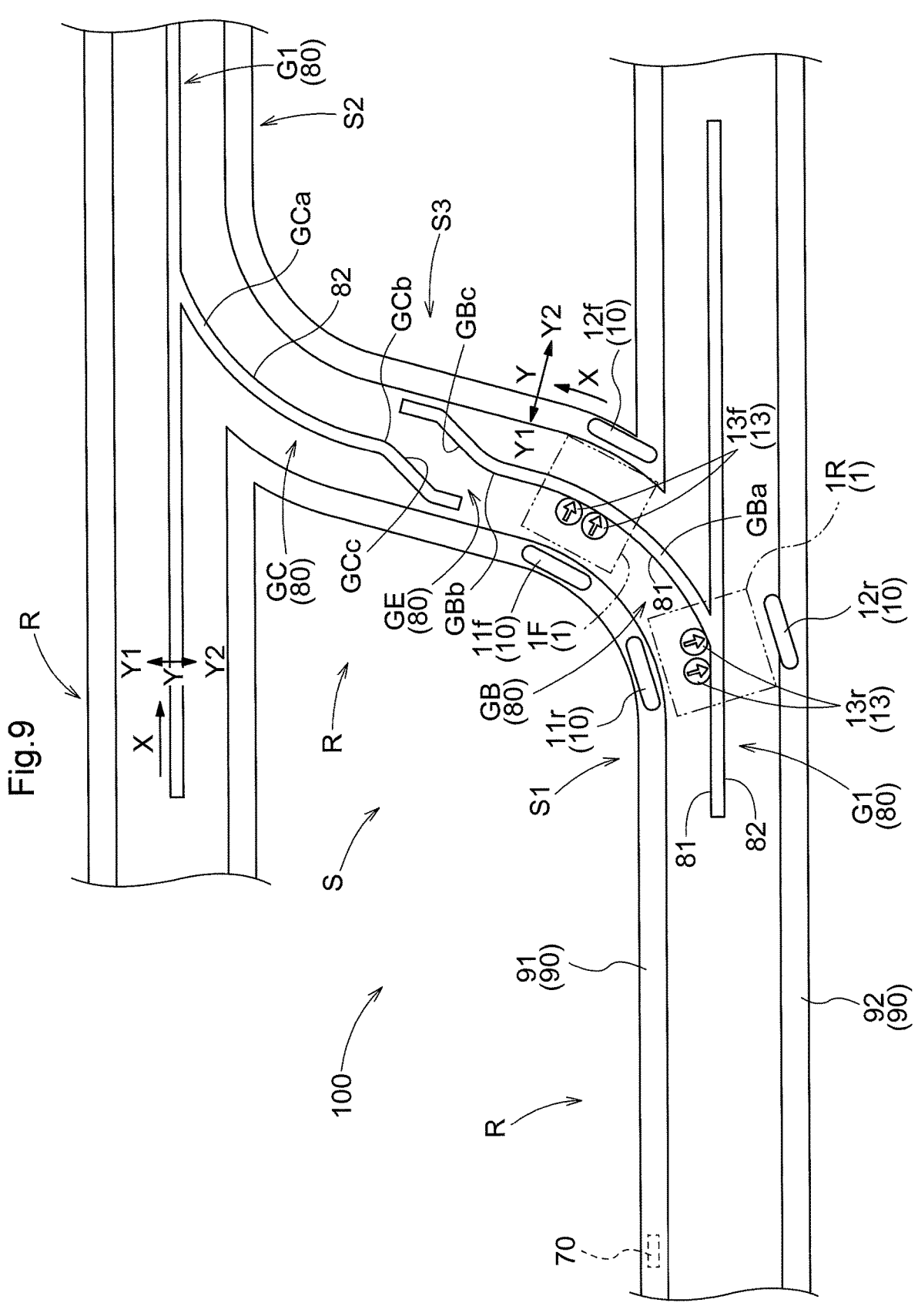
FIG. 9 is a diagram showing a state at a point in time at which preliminary biasing processing is started.

Here, the guide wheel drive units 5 are configured to move the guide wheels 13 along the width direction Y by biasing the guide wheels 13 in the width direction Y as described above. The guide wheel drive units 5 place the guide wheels 13 at the first position P1 or the second position P2 so that the guide wheels 13 roll on the first-side surface 81 or the second-side surface 82 of the guide rail 80. As shown in FIG. 7, for example, when the transport vehicle V travels through the branch-junction section S, the guide wheels 13 roll on the first-side surface 81 of the guide rail 80 in the branch guide portion GB, and roll on the second-side surface 82 of the guide rail 80 in the junction guide portion GC. Therefore, the position of the guide wheels 13 in the width direction Y needs to be changed from the first position P1 to the second position P2 in the switching area GE. As shown in FIG. 9, in the article transport facility 100 according to the present disclosure, before the guide wheels 13 enter the switching area GE, preliminary biasing processing is executed in which the guide wheel drive units 5 are controlled to bias the guide wheels 13 in the direction from the first position P1 toward the second position P2.

The following describes processing performed by the control system H when the transport vehicle V travels through the branch junction section S in chronological order with reference to FIGS. 7 to 12. Note that white arrows shown on the guide wheels 13 in FIGS. 7 to 12 indicate the direction in which the guide wheels 13 are biased, and do not indicate that the positions of the guide wheels 13 are changed.

As shown in FIG. 7, in the present embodiment, when the transport vehicle V travels through the branch junction section S, the control system H controls the guide wheel drive units 5 to place the guide wheels 13 at the first position P1 at a time that is (i) before executing the preliminary biasing processing and (ii) before the guide wheels 13 enter the first section S1. In this example, after the detection unit 4 has detected the information holder 70 located just before the branch junction section S, the control system H controls the guide wheel drive units 5 based on the result of detection performed by the detection unit 4 to place the guide wheels 13 at the first position P1. The guide wheels 13 are biased by the guide wheel drive units 5 toward the first side Y1 in the width direction to be placed at the first position P1. Then, after the guide wheels 13 have entered the first section S1, the control system H brings the guide wheels 13 into contact with the first-side surface 81 of the branch guide portion GB from the first side Y1 in the width direction. As a result, the transport vehicle V travels in the direction branched from the travel route R toward the first side Y1 in the width direction. Note that the control system H may place the front guide wheels 13f and the rear guide wheels 13r at the first position P1 simultaneously or at different timings before the guide wheels 13 enter the first section S1, by controlling the guide wheel drive units 5.

As shown in FIG. 8, when the front guide wheels 13f start to come into contact with the branch guide portion GB, the first rear wheel 11r rolls on the straight portion of the travel rail 90 and the first front wheel 11f rolls on the curved portion (the inner side of the curved portion) of the travel rail 90. Accordingly, the first rear wheel 11r rolls over a longer distance than the first front wheel 11f, and a rotation speed difference arises between the first rear wheel 11r and the first front wheel 11f. The determination unit Ha determines that the front guide wheels 13f have started to come into contact with the branch guide portion GB in response to the rotation speed difference changing by an amount greater than or equal to the prescribed threshold value.

As shown in FIG. 9, the control system H executes the preliminary biasing processing in which the guide wheel drive units 5 are controlled to bias the guide wheels 13 in the direction from the first position P1 toward the second position P2 in the state where the guide wheels 13 are at the first position P1 and are in contact with the first-side surface 81 of the branch guide portion GB from the first side Y1 in the width direction before entering the switching area GE.

In the present embodiment, the control system H executes the preliminary biasing processing based on the result of determination performed by the determination unit Ha. In this example, the control system H executes the preliminary biasing processing in a period from when the determination unit Ha determines that the guide wheels 13 have started to come into contact with the branch guide portion GB until when the transport vehicle V has traveled a predetermined distance. The "predetermined distance" is a known distance that the transport vehicle V travels during a period from when the guide wheels 13 enter the branch guide portion GB until when the guide wheels 13 reach the switching area GE. In the present embodiment, the measurement unit 3 measures a distance traveled by the transport vehicle V from when the determination unit Ha makes determination (when it is determined that the guide wheels 13 have started to come into contact with the branch guide portion GB), based on rotation speeds of the travel wheels 10. The control system H executes the preliminary biasing processing before the distance traveled by the transport vehicle V, which is measured by the measurement unit 3, exceeds the predetermined distance (distance that the transport vehicle V travels during the period from when the guide wheels 13 enter the branch guide portion GB until when the guide wheels 13 reach the switching area GE).

In the present embodiment, the control system H executes the preliminary biasing processing simultaneously on the front guide wheels 13f and the rear guide wheels 13r at a time that is (i) after the rear guide wheels 13r start to come into contact with the branch guide portion GB and (ii) before the front guide wheels 13f enter the switching area GE. In this example, the determination unit Ha determines that the rear guide wheels 13r have started to come into contact with the branch guide portion GB based on a distance traveled by the transport vehicle V from when the determination unit Ha determines that the front guide wheels 13f have started to come into contact with the branch guide portion GB. That is, a spacing distance in the travel direction X between the front guide wheels 13f and the rear guide wheels 13r is already known, and accordingly, the determination unit Ha can determine that the rear guide wheels 13r have started to come into contact with the branch guide portion GB in response to the transport vehicle V traveling the spacing distance from when the determination unit Ha determines that the front guide wheels 13f have started to come into contact with the branch guide portion GB. As described above, the preliminary biasing processing is executed simultaneously on the front guide wheels 13f and the rear guide wheels 13r, and thus the front guide wheels 13f and the rear guide wheels 13r are simultaneously biased toward the second side Y2 in the width direction. However, the front guide wheels 13f and the rear guide wheels 13r are in contact with the first-side surface 81 of the branch guide portion GB from the first side Y1 in the width direction, and therefore are not displaced in the width direction Y even when biased toward the second side Y2 in the width direction. That is, the guide wheels 13 are pressed against the first-side surface 81 with a force set according to the weight of the transport vehicle V. The biasing force applied to the guide wheels 13 in the preliminary biasing processing is set such that the guide wheels 13 are kept at the first position P1 (i.e., the guide wheels 13 are kept from being displaced in the width direction Y).

Figure 10:
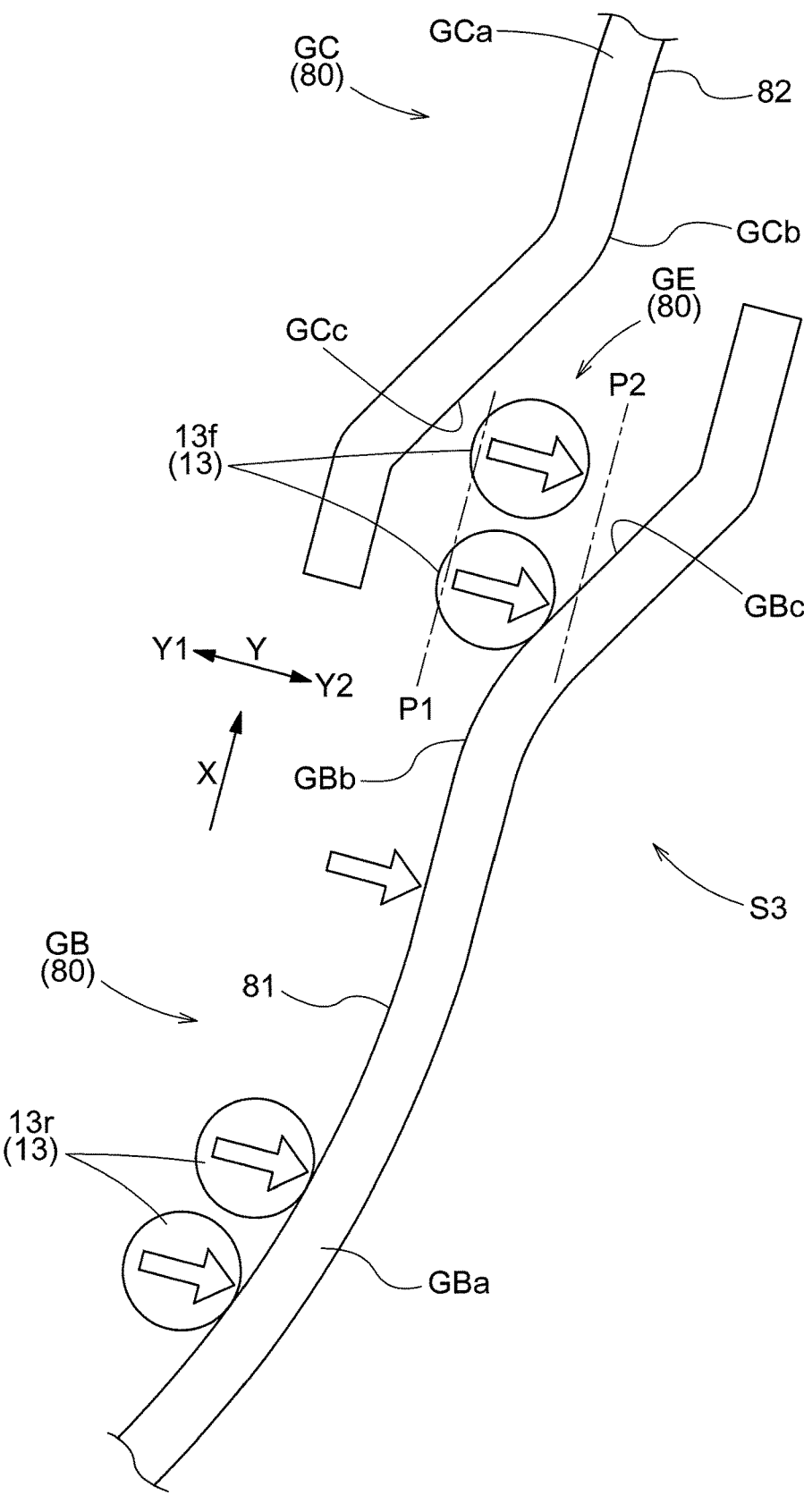
FIG. 10 is a diagram showing a state at a point in time at which a front guide wheel is moving along an inclined portion of the branch guide portion.
Figure 11:
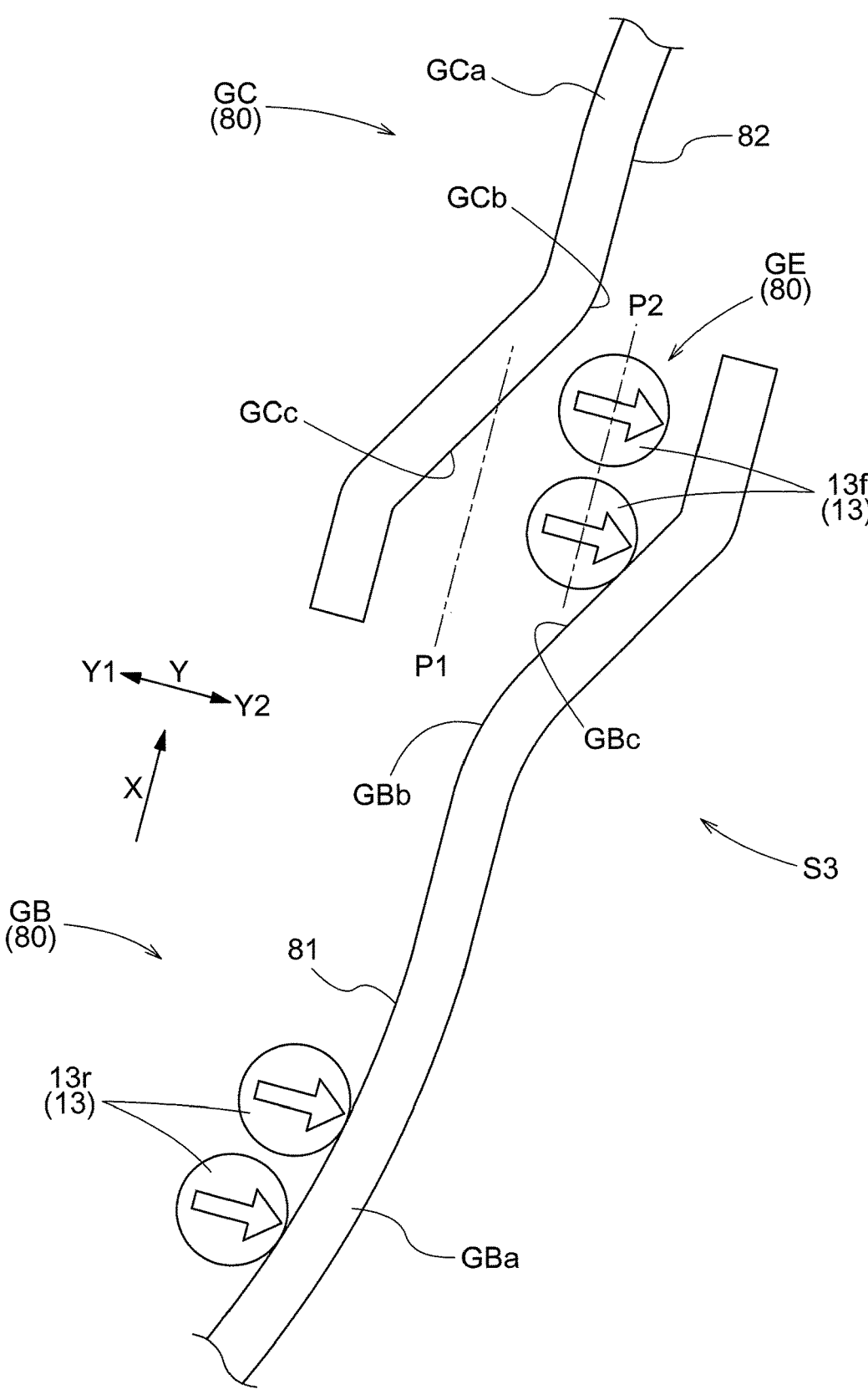
FIG. 11 is a diagram showing a state at a point in time at which a front guide wheel comes into contact with an inclined portion of a junction guide portion.
Figure 12:
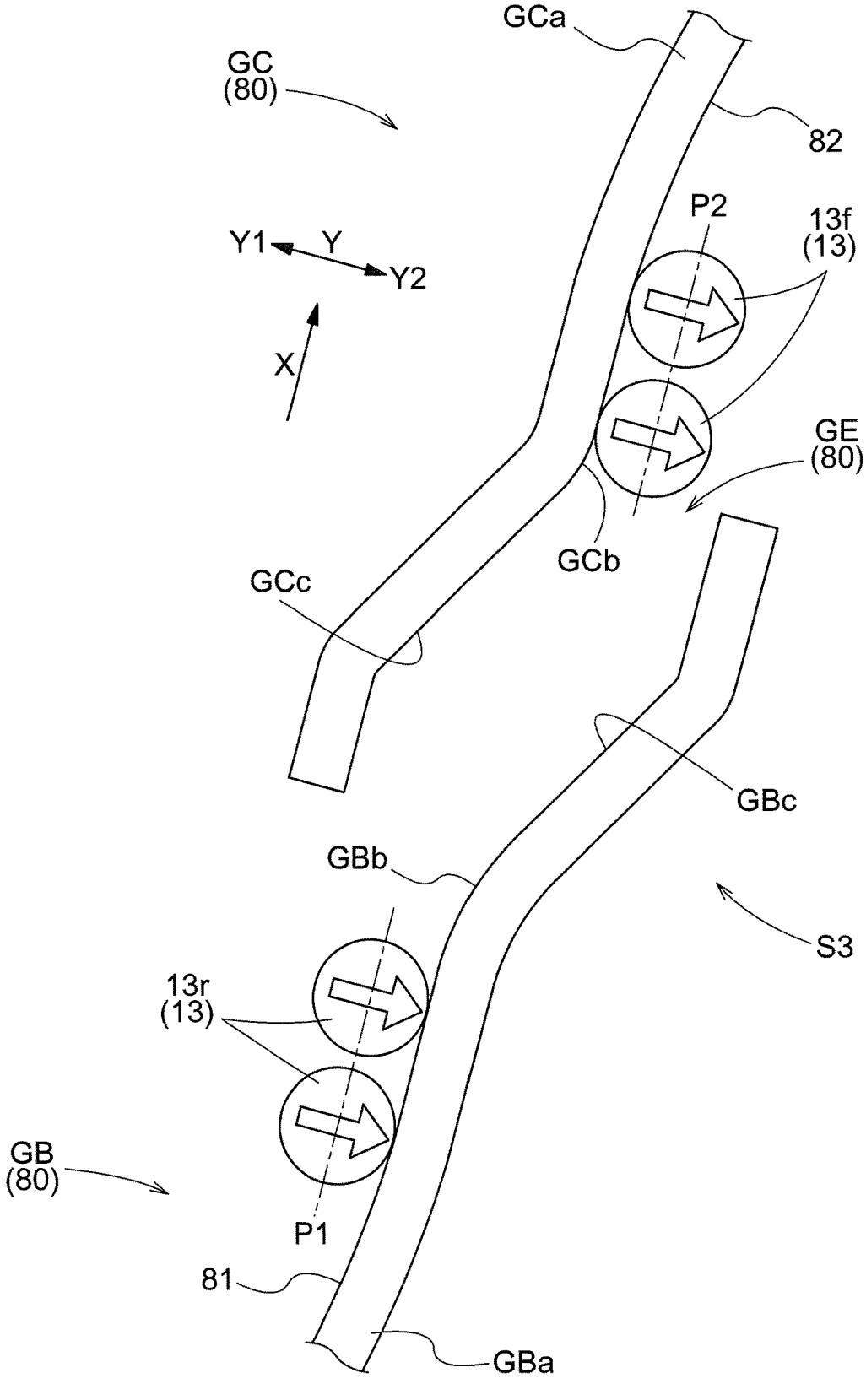
FIG. 12 is a diagram showing a state at a point in time at which the front guide wheels are moving along an extending portion of the junction guide portion.

As shown in FIGS. 10 to 12, the control system H allows the guide wheels 13 to pass through the switching area GE while executing the preliminary biasing processing (in this example, in the state where the guide wheels 13 are biased toward the second side Y2 in the width direction). By allowing the guide wheels 13 to pass through the switching area GE while executing the preliminary biasing processing, the control system H moves the guide wheels 13 from the first position P1 to the second position P2 in the switching area GE and brings the guide wheels 13 into contact with the second-side surface 82 of the junction guide portion GC from the second side Y2 in the width direction.

As shown in FIG. 10, in the present embodiment, the control system H allows the guide wheels 13 to pass through the branch side extending portion GBa and the branch side curved portion GBb and to move along the branch side inclined portion GBc while executing the preliminary biasing processing. At this time, the guide wheels 13 move to the second position P2 while being in contact with the branch side inclined portion GBc, which is inclined toward second side Y2 in the width direction, and being biased toward the second side Y2 in the width direction. That is, the control system H places the guide wheels 13 at the second position P2 by moving the guide wheels 13 along the branch side inclined portion GBc. As described above, the direction in which the guide wheels 13 are biased is the same as the direction in which the branch side inclined portion GBc is inclined, and accordingly, the guide wheels 13 can smoothly pass through the switching area GE. Therefore, vibration of the transport vehicle V can be suppressed. Moreover, the guide wheels 13 are biased before entering the switching area GE in order to switch the position of the guide wheels 13 in the width direction Y. Accordingly, the travel speed of the transport vehicle V need not be reduced in order to switch the position of the guide wheels 13 in the width direction Y. Therefore, a reduction in the travel speed of the transport vehicle V can be suppressed.

As described above, in the present embodiment, the junction guide portion GC includes the junction side inclined portion GCc and the junction side curved portion GCb in addition to the junction side extending portion GCa. Therefore, even if the second position P2 is shifted toward the first side Y1 in the width direction from the position shown in FIG. 11, for example, the guide wheels 13 can be moved smoothly as described below. In such a case, the control system H brings the guide wheels 13 into contact with the junction side inclined portion GCc and moves the guide wheels 13 along the junction side inclined portion GCc while executing the preliminary biasing processing. At this time, the guide wheels 13 move while being in contact with the junction side inclined portion GCc, which is inclined toward the second side Y2 in the width direction, and being biased toward the second side Y2 in the width direction. As described above, the direction in which the guide wheels 13 are biased is the same as the direction in which the junction side inclined portion GCc is inclined, and accordingly, the guide wheels 13 can smoothly pass through the switching area GE. Therefore, vibration of the transport vehicle V can be suppressed.

After moving the guide wheels 13 along the junction side inclined portion GCc, the control system H allows the guide wheels 13 to pass through the junction side curved portion GCb and the junction side extending portion GCa. The guide wheels 13 can be smoothly moved because the guide wheels 13 enter the junction side extending portion GCa via the junction side curved portion GCb. Therefore, vibration of the transport vehicle V can be suppressed.

OTHER EMBODIMENTS

Next, other embodiments of the article transport facility will be described.

(1) In the above embodiment, an example is described in which the control system H executes the preliminary biasing processing in a period from when the determination unit Ha determines that the guide wheels 13 have started to come into contact with the branch guide portion GB until when the transport vehicle V has traveled the predetermined distance. However, there is no limitation to this example, and the control system H may also be configured to execute the preliminary biasing processing immediately after the determination unit Ha determines that the guide wheels 13 have started to come into contact with the branch guide portion GB.

(2) In the above embodiment, an example is described in which the control system H executes the preliminary biasing processing simultaneously on the front guide wheels 13$f$ and the rear guide wheels 13$r$ at a time that is (i) after the rear guide wheels 13$r$ start to come into contact with the branch guide portion GB and (ii) before the front guide wheels 13$f$ enter the switching area GE. However, there is no limitation to this example, and the control system H may also be configured to execute the preliminary biasing processing on the front guide wheels 13$f$ after the front guide wheels 13$f$ start to come into contact with the branch guide portion GB, and execute the preliminary biasing processing on the rear guide wheels 13$r$ at a time that is (i) after the rear guide wheels 13$r$ start to come into contact with the branch guide portion GB and (ii) after executing the preliminary biasing processing on the front guide wheels 13$f$ That is, the control system H may also be configured to execute the preliminary biasing processing sequentially rather than simultaneously on the front guide wheels 13$f$ and the rear guide wheels 13$r$.

(3) In the above embodiment, an example is described in which the determination unit Ha makes determination based on a rotation speed difference between (i) a rotation speed of at least one of the first rear wheel 11$r$ and the second rear wheel 12$r$ and (ii) a rotation speed of at least one of the first front wheel 11$f$ and the second front wheel 12$f$. However, there is no limitation to this example, and in a case where the transport vehicle V travels through a curved section in the double-side travel state, for example, the determination unit Ha may also make determination based on a rotation speed difference between rotation speeds of a pair of travel wheels 10 spaced apart from each other in the width direction Y at the same position in the travel direction X. That is, the basis for the determination may be a rotation speed difference between a rotation speed of the first front wheel 11$f$ and a rotation speed of the second front wheel 12$f$ or a rotation speed difference between a rotation speed of the first rear wheel 11$r$ and a rotation speed of the second rear wheel 12$r$. In this case, the measurement unit 3 is preferably configured to separately measure the rotation speeds of the pair of travel wheels 10 spaced apart from each other in the width direction Y.

(4) In the above embodiment, an example is described in which the determination unit Ha determines that the guide wheels 13 have started to come into contact with the branch guide portion GB in response to a rotation speed difference between rotation speeds of two or more target travel wheels 10 spaced apart from each other in the travel direction X or the width direction Y changing by an amount greater than or equal to the prescribed threshold value. However, there is no limitation to this example, and the determination unit Ha may also be configured to determine that the guide wheels 13 have started to come into contact with the branch guide portion GB based on a current position of the transport vehicle V detected by the detection unit 4 or a distance traveled by the transport vehicle V from the detected current position. Note that the distance traveled by the transport vehicle V can be measured by the measurement unit 3.

(5) In the above embodiment, an example is described in which the plurality of travel wheels 10 include the front wheels 10$f$ and the rear wheels 10$r$. However, there is no limitation to this configuration, and a configuration is also possible in which the plurality of travel wheels 10 include only two travel wheels 10 spaced apart from each other in the width direction Y.

(6) In the above embodiment, an example is described in which the transport vehicle V includes the front travel portion 1F and the rear travel portion 1R. However, there is no limitation to this example, and a configuration is also possible in which the transport vehicle V includes one travel portion 1.

(7) In the above embodiment, an example is described in which either one of the pair of travel rails 90 is divided in the joint portion between the connecting section S3 and the first section S1 and the joint portion between the connecting section S3 and the second section S2, and the transport vehicle V travels through these joint portions in the single-side travel state. However, there is no limitation to this example, and a configuration is also possible in which the pair of travel rails 90 are not divided. In this case, the transport vehicle V travels in the double-side travel state.

(8) The configurations disclosed in the above embodiment can also be applied in combination with configurations disclosed in the other embodiments so long as no contradiction arises. The embodiments disclosed in the present specification including the other configurations are merely examples in all aspects. Therefore, various modifications can be made as appropriate within a range not departing from the gist of the present disclosure.

Outline of the Above Embodiment

The following describes the article transport facility described above.

An article transport facility including: a pair of travel rails extending along a travel route; a transport vehicle configured to travel along the travel route and transport an article; a guide rail configured to guide a direction of travel of the transport vehicle in a branch junction section in which the travel route branches and joins another route; and a control system configured to control the transport vehicle, wherein the transport vehicle includes: travel wheels configured to roll on upper surfaces of the pair of travel rails; a guide wheel configured to roll on a first-side surface or a second-side surface of the guide rail; and a guide wheel drive unit configured to move the guide wheel in a width direction between a first position at which the guide wheel rolls on the first-side surface and a second position at which the guide wheel rolls on the second-side surface, the first-side surface facing a first side in the width direction orthogonal to a travel direction extending along the travel route as viewed in an up-down direction, and the second-side surface facing a second side in the width direction, which is opposite to the first side, the branch junction section includes: a first section; a second section extending side by side with the first section; and a connecting section connecting the first section and the second section, the connecting section branches off from the first section toward the first side in the width direction and joins the second section from the second side in the width direction, the guide rail includes a branch guide portion spanning from the first section to an intermediate position in the connecting section, a junction guide portion spanning from an intermediate position in the connecting section to the second section, and a switching area configured to allow the guide wheel to move in the width direction between the branch guide portion and the junction guide portion in the travel direction, in a case where the transport vehicle travels through the branch junction section,

the control system executes preliminary biasing processing including controlling the guide wheel drive unit to bias the guide wheel in a direction from the first position toward the second position while the guide wheel is at the first position and is in contact with the first-side surface of the branch guide portion from the first side in the width direction before entering the switching area, and the control system allows the guide wheel to pass through the switching area while executing the preliminary biasing processing.

According to this configuration, as a result of the preliminary biasing processing being executed, the guide wheel is biased in the direction from the first position toward the second position while being at the first position and being in contact with the first-side surface of the branch guide portion from the first side in the width direction before entering the switching area. Then, the guide wheel is allowed to pass through the switching area while the preliminary biasing processing is executed. As described above, the guide wheel is biased before entering the switching area, and accordingly, switching of the position of the guide wheel is not delayed even if the travel speed of the transport vehicle is not reduced, and the guide wheel can be moved from the first position to the second position at the same time as entering the switching area. Moreover, vibration of the transport vehicle can be suppressed because the guide wheel is kept from coming into contact with the guide rail with large impact due to switching of the position of the guide wheel being delayed. As described above, according to this configuration, it is possible to suppress vibration of the transport vehicle and a reduction in the travel speed of the transport vehicle in the branch junction section.

It is preferable that, in the case where the transport vehicle travels through the branch junction section, the control system controls the guide wheel drive unit to place the guide wheel at the first position at a time that is (i) before executing the preliminary biasing processing and (ii) before the guide wheel enters the first section so that the guide wheel comes into contact with the first-side surface of the branch guide portion from the first side in the width direction after entering the first section, and the control system allows the guide wheel to pass through the switching area while executing the preliminary biasing processing to move the guide wheel from the first position to the second position in the switching area and bring the guide wheel into contact with the second-side surface of the junction guide portion from the second side in the width direction.

According to this configuration, it is possible to make the transport vehicle travel appropriately through the branch junction section.

It is preferable that the travel wheels include a plurality of travel wheels spaced apart from each other in at least either the travel direction or the width direction, the control system includes a determination unit configured to determine that the guide wheel has come into contact with the branch guide portion after entering the first section, the determination unit determines that the guide wheel has started to come into contact with the branch guide portion in response to a rotation speed difference between rotation speeds of two or more target travel wheels spaced apart from each other in the travel direction or the width direction changing by an amount greater than or equal to a prescribed threshold value, and the control system executes the preliminary biasing processing based on a result of determination performed by the determination unit.

According to this configuration, the determination unit uses the rotation speed difference between rotation speeds of the two or more target travel wheels to determine that the guide wheel has started to come into contact with the branch guide portion, and therefore, it is unnecessary to use a dedicated sensor or the like to detect contact between the guide wheel and the branch guide portion. Also, the preliminary biasing processing is executed based on the result of determination performed by the determination unit, and therefore, the preliminary biasing processing can be executed at an appropriate timing after the guide wheel has started to come into contact with the branch guide portion.

It is preferable that the pair of travel rails include a first travel rail on the first side in the width direction and a second travel rail on the second side in the width direction, the plurality of travel wheels include: a first front wheel configured to roll on an upper surface of the first travel rail; a first rear wheel configured to roll on the first travel rail behind the first front wheel in a direction of travel; a second front wheel configured to roll on an upper surface of the second travel rail; and a second rear wheel configured to roll on the second travel rail behind the second front wheel in the direction of travel, and the rotation speed difference is a difference between (i) a rotation speed of at least one of the first rear wheel and the second rear wheel and (ii) a rotation speed of at least one of the first front wheel and the second front wheel.

When the transport vehicle travels through a curved section of the travel route, the speed of a wheel on the inner side in a radial direction of an arc constituting the curved section decreases compared with its speed when traveling in a straight section, and the speed of a wheel on the outer side in the radial direction of the arc increases compared with its speed when traveling in a straight section. Accordingly, when the pair of front wheels of the transport vehicle enter a curved section from a straight section, the speed of one of the front wheels decreases and the speed of the other front wheel increases compared with the speed of the rear wheels. According to this configuration, it is possible to determine that the transport vehicle has entered a curved section from a straight section by detecting such a phenomenon. Usually, the branch junction section includes a curved section, and the guide rail is disposed in correspondence with the curved section. Therefore, according to this configuration, it is possible to appropriately determine that the guide wheel has started to come into contact with the branch guide portion.

It is preferable that the control system executes the preliminary biasing processing in a period from when the determination unit determines that the guide wheel has started to come into contact with the branch guide portion until when the transport vehicle has traveled a predetermined distance.

According to this configuration, the preliminary biasing processing can be executed based on the predetermined distance, and therefore, the control can be simplified.

It is preferable that the control system executes the preliminary biasing processing immediately after the determination unit determines that the guide wheel has started to come into contact with the branch guide portion.

According to this configuration, it is possible to appropriately execute the preliminary biasing processing before the guide wheel enters the switching area.

It is preferable that the transport vehicle includes: a front travel portion including a front wheel as one of the travel wheels; a rear travel portion including a rear wheel as one of the travel wheels; a front guide wheel serving as the guide wheel in the front travel portion; and a rear guide wheel serving as the guide wheel in the rear travel portion, and the control system executes the preliminary biasing processing simultaneously on both the front guide wheel and the rear guide wheel at a time that is (i) after the rear guide wheel starts to come into contact with the branch guide portion and (ii) before the front guide wheel enters the switching area.

According to this configuration, the preliminary biasing processing is executed simultaneously on both the front guide wheel and the rear guide wheel, and therefore, the control can be simplified.

It is preferable that the transport vehicle includes: a front travel portion including a front wheel as one of the travel wheels; a rear travel portion including a rear wheel as one of the travel wheels; a front guide wheel serving as the guide wheel in the front travel portion; and a rear guide wheel serving as the guide wheel in the rear travel portion, and the control system executes the preliminary biasing processing on the front guide wheel after the front guide wheel starts to come into contact with the branch guide portion, and executes the preliminary biasing processing on the rear guide wheel at a time that is (i) after the rear guide wheel starts to come into contact with the branch guide portion and (ii) after executing the preliminary biasing processing on the front guide wheel.

According to this configuration, the preliminary biasing processing can be executed appropriately on each of the front guide wheel and the rear guide wheel before the guide wheel enters the switching area.

INDUSTRIAL APPLICABILITY

The techniques according to the present disclosure are applicable to an article transport facility including a pair of travel rails extending along a travel route, a transport vehicle configured to travel along the travel route and transport an article, a guide rail configured to guide the direction of travel of the transport vehicle in a branch junction section in which the travel route branches and joins another route, and a control system configured to control the transport vehicle.

What is claimed is:

1. An article transport facility comprising:
a pair of travel rails extending along a travel route;
a transport vehicle configured to travel along the travel route and transport an article;
a guide rail configured to guide a direction of travel of the transport vehicle in a branch-junction section in which the travel route branches and joins another route; and
a control system configured to control the transport vehicle,
wherein the transport vehicle comprises:
travel wheels configured to roll on upper surfaces of the pair of travel rails;
a guide wheel configured to roll on a first-side surface or a second-side surface of the guide rail, the first-side surface facing a first side Y1 and the second-side surface facing an opposite second side Y2 in a width direction Y orthogonal to a travel direction X extending along the travel route; and a guide wheel drive unit configured to move the guide wheel in the width direction Y between a first position at which the guide wheel rolls on the first-side surface and a second position at which the guide wheel rolls on the second-side surface, wherein the branch-junction section comprises:

a first section;

a second section extending side by side with the first section; and a connecting section connecting the first section and the second section, wherein the connecting section branches off from the first section toward the first side Y1 in the width direction Y and joins the second section from the second side Y2 in the width direction Y, wherein the guide rail comprises:

a branch guide portion spanning from the first section to an intermediate position in the connecting section;

a junction guide portion spanning from an intermediate position in the connecting section to the second section; and a switching area, located along the travel direction X, configured to allow the guide wheel to move, in the width direction Y, between the branch guide portion and the junction guide portion, wherein in a case where the transport vehicle travels through the branch-junction section:

the control system is configured to execute preliminary biasing processing including controlling the guide wheel drive unit to bias the guide wheel in a direction from the first position toward the second position while the guide wheel is at the first position and is in contact with the first-side surface of the branch guide portion from the first side Y1 in the width direction Y prior to entering the switching area, and the control system is further configured to cause the guide wheel to move in the switching area by executing the preliminary biasing processing to keep the guide wheel in contact with the first-side surface from the branch guide portion to the switching area.

2. The article transport facility according to claim 1, wherein, in the case where the transport vehicle travels through the branch-junction section:

the control system is configured to control the guide wheel drive unit to place the guide wheel at the first position (i) prior to the preliminary biasing processing being executed and (ii) prior to the guide wheel entering the first section, such-se that the guide wheel comes into contact with the first-side surface of the branch guide portion from the first side Y1 in the width direction Y subsequent to the guide wheel entering the first section, and the control system is further configured to cause the guide wheel to pass through the switching area while the preliminary biasing processing is being executed to move the guide wheel from the first position to the second position in the switching area and bring the guide wheel into contact with the second-side surface of the junction guide portion from the second side Y2 in the width direction Y.

3. The article transport facility according to claim 1, wherein:

the travel wheels comprise a plurality of travel wheels spaced apart from each other in at least either the travel direction X or the width direction Y, the control system comprises a determination unit configured to determine that the guide wheel has come into contact with the branch guide portion subsequent to the guide wheel entering the first section, the determination unit is configured to determine that the guide wheel has started to come into contact with the branch guide portion in response to a rotation speed difference between rotation speeds of two or more target travel wheels spaced apart from each other in the travel direction X or the width direction Y, changing by an amount greater than or equal to a prescribed threshold value, and the control system is configured to execute the preliminary biasing processing based on a result of determination performed by the determination unit.

4. The article transport facility according to claim 3, wherein:

the pair of travel rails comprise a first travel rail on the first side Y1 in the width direction Y and a second travel rail on the second side Y2 in the width Y direction, the plurality of travel wheels comprise:

a first front wheel configured to roll on an upper surface of the first travel rail;

a first rear wheel configured to roll on the first travel rail behind the first front wheel in a direction of travel;

a second front wheel configured to roll on an upper surface of the second travel rail; and a second rear wheel configured to roll on the second travel rail behind the second front wheel in the direction of travel, and the rotation speed difference is a difference between (i) a rotation speed of at least one of the first rear wheel and the second rear wheel and (ii) a rotation speed of at least one of the first front wheel and the second front wheel.

5. The article transport facility according to claim 3, wherein the control system is configured to execute the preliminary biasing processing subsequent to the determination unit determining that the guide wheel has started to come into contact with the branch guide portion and prior to the transport vehicle having traveled a predetermined distance.

6. The article transport facility according to claim 3, wherein the control system is configured to execute the preliminary biasing processing immediately subsequent to the determination unit determining that the guide wheel has started to come into contact with the branch guide portion.

7. The article transport facility according to claim 1, wherein the transport vehicle comprises:

a front travel portion comprising a front wheel as one of the travel wheels;

a rear travel portion comprising a rear wheel as one of the travel wheels;

a front guide wheel serving as the guide wheel in the front travel portion; and a rear guide wheel serving as the guide wheel in the rear travel portion, and wherein the control system is configured to execute the preliminary biasing processing simultaneously on both the front guide wheel and the rear guide wheel (i) subsequent to the rear guide wheel starting to come into contact with the branch guide portion and (ii) prior to the front guide wheel entering the switching area.

8. The article transport facility according to claim 1, wherein the transport vehicle comprises:

a front travel portion comprising a front wheel as one of the travel wheels;

a rear travel portion comprising a rear wheel as one of the travel wheels;

a front guide wheel serving as the guide wheel in the front travel portion; and a rear guide wheel serving as the guide wheel in the rear travel portion, and the control system is configured to execute the preliminary biasing processing on the front guide wheel subsequent to the front guide wheel starting to come into contact with the branch guide portion, and is further configured to execute the preliminary biasing processing on the rear guide wheel (i) subsequent to the rear guide wheel starting to come into contact with the branch guide portion and (ii) subsequent to the control system executing the preliminary biasing processing on the front guide wheel.

9. The article transport facility according to claim 1, wherein the first-side surface is curved continuously from the branch guide portion to the switching area.

\* \* \* \* \*